US012057840B1

(12) United States Patent
Yu et al.

(10) Patent No.: US 12,057,840 B1
(45) Date of Patent: Aug. 6, 2024

(54) COMPLEMENTARY SINGLE-ENDED TO DIFFERENTIAL CONVERTER WITH WEIGHED INTERPOLATION

(71) Applicant: Synopsys, Inc., Sunnyvale, CA (US)

(72) Inventors: Yue Yu, Ottawa (CA); Kuan Zhou, Boxborough, MA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/095,436

(22) Filed: Jan. 10, 2023

Related U.S. Application Data

(60) Provisional application No. 63/299,374, filed on Jan. 13, 2022, provisional application No. 63/298,167, filed on Jan. 10, 2022.

(51) Int. Cl.
| | |
|---|---|
| *H03K 3/02* | (2006.01) |
| *G11C 27/02* | (2006.01) |
| *H03K 3/037* | (2006.01) |
| *H03K 19/173* | (2006.01) |
| *H03K 19/20* | (2006.01) |

(52) U.S. Cl.
CPC ............ *H03K 3/037* (2013.01); *G11C 27/02* (2013.01); *H03K 19/1733* (2013.01); *H03K 19/20* (2013.01)

(58) Field of Classification Search
CPC .......... H03K 3/02; H03K 3/027; H03K 3/037; H03K 19/0005; H03K 19/0175; H03K 19/02; H03K 19/173; H03K 19/1733; H03K 19/20; G11C 27/02
See application file for complete search history.

(56) References Cited

U.S. PATENT DOCUMENTS

| | | | |
|---|---|---|---|
| 7,119,602 B2 | 10/2006 | Davis | |
| 2008/0265964 A1* | 10/2008 | Park | H03K 19/018528 327/257 |
| 2009/0284291 A1* | 11/2009 | Teramoto | H03K 5/151 327/158 |

OTHER PUBLICATIONS

Toh, Y., et al., "Single-Ended to Differential Converter for Multiple-Stage Single-Ended Ring Oscillators," IEEE Journal of Solid-State Circuits, 2003, vol. 38(1), pp. 141-145.

* cited by examiner

*Primary Examiner* — Long Nguyen
(74) *Attorney, Agent, or Firm* — Weaver Austin Villeneuve & Sampson LLP

(57) ABSTRACT

A single-ended to a differential signal converter (converter) includes, in part, first, second, and third inverting elements, each having a first size, and coupled in series to form a chain of inverting elements. The converter further includes a fourth inverting element of a second size and coupled to the input of the first inverting element, a fifth inverting element of a third size and coupled to an output terminal of the first inverting element, a sixth inverting element of the third size and coupled to an output of the second inverting element, and a seventh inverting element of the second size and coupled to the output of the third inverting element. The outputs of the fourth and sixth inverting elements form a first one of the differential signals. The outputs of the fifth and seventh inverting elements form a second one of the differential signals.

19 Claims, 8 Drawing Sheets

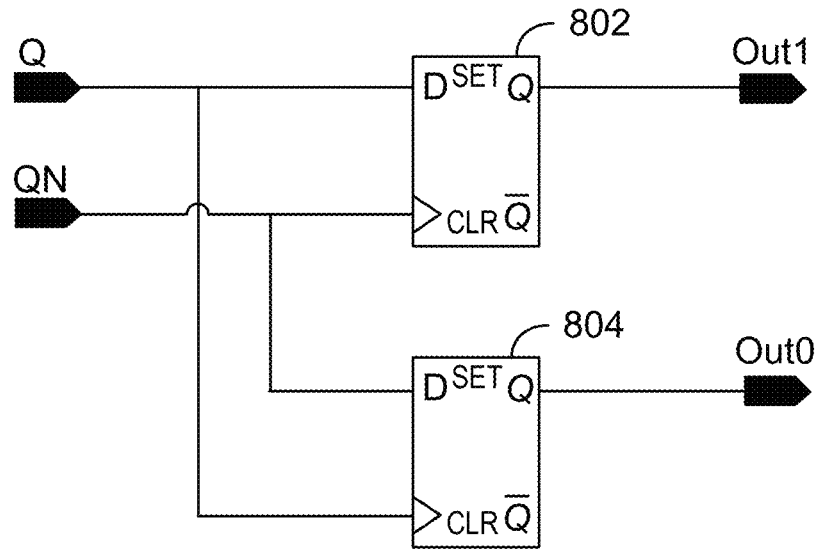
FIG. 8A
FIG. 8B
FIG. 8C
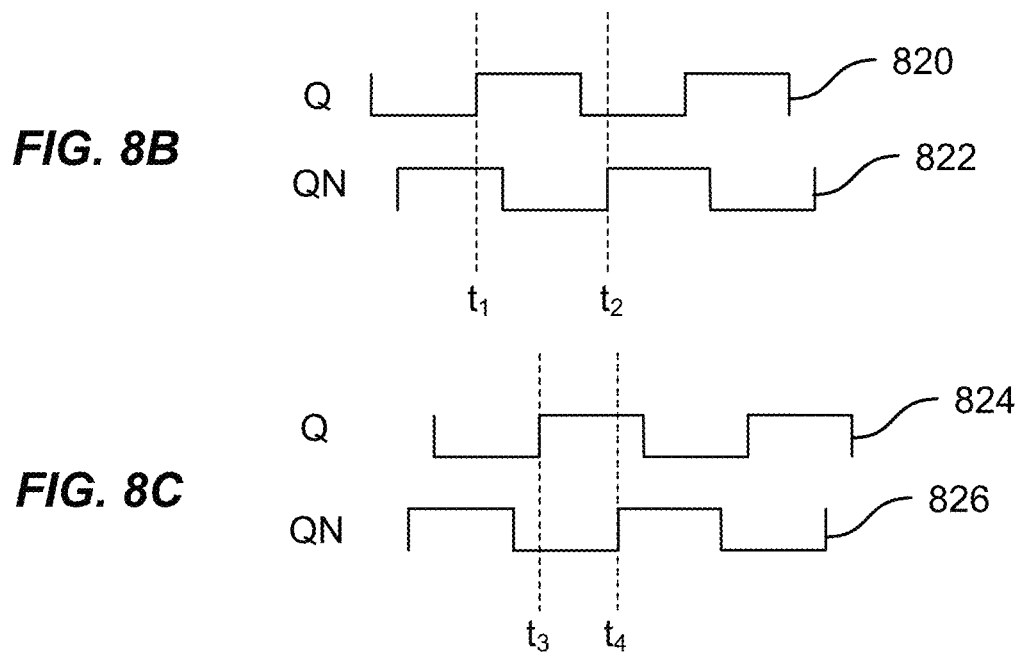

US 12,057,840 B1

COMPLEMENTARY SINGLE-ENDED TO DIFFERENTIAL CONVERTER WITH WEIGHED INTERPOLATION

RELATED APPLICATION

The present application claims benefit under 35 USC 119(e) of U.S. Patent Application No. 63/298,167, filed Jan. 10, 2022, and U.S. Patent Application No. 63/299,374, filed Jan. 13, 2022, the contents of both which are incorporated herein by reference in their entirety.

TECHNICAL FIELD

The present disclosure relates to integrated circuits (ICs), and more particularly, to generating a differential signal from a single-ended signal in an IC.

BACKGROUND

Converting a single-ended signal to a differential signal may be a challenge in high-speed ICs. Double-Data Rate (DDR) memory inputs/outputs (I/Os) run at 8533 megabits per second (Mbps). Serializers/Deserializers (SerDes) have even higher data rates. Half-rate or quarter-rate circuit design architectures are widely used to overcome the bottleneck in speed and timing. In such architectures, however, converting a single-ended signal to a differential signal poses difficulties. For example, a single-ended clock signal is first converted to a differential signal before sampling the half-rate data signals. The sampled data signals are then combined into full rate data signals. The duty cycle and the delays of the differential output clock signals are critical in high-speed I/Os.

SUMMARY

A single-ended to a differential signal converter, in accordance with one embodiment of the present disclosure, includes, in part, first, second, and third inverting elements coupled in series to form a chain of inverting elements, each of the first, second, and third inverting elements is of a first size. The first inverting element has an input terminal receiving the single-ended signal. The fourth inverting element is of a second size and is coupled to the input terminal of the first inverting element. The fifth inverting element is of a third size and is coupled to an output terminal of the first inverting element. The sixth inverting element is of the third size and is coupled to an output terminal of the second inverting element. The output terminals of the fourth and sixth inverting elements are connected together to form a first one of the differential signals. The seventh inverting element is of the second size and is coupled to an output terminal of the third inverting element. The output terminals of the fifth and seventh inverting elements are connected together to form a second one of the differential signals. The capacitance at the output terminal of each of the first, second and third inverting elements has a value that is substantially the same as the capacitance at the input terminal of the first inverting element.

In one embodiment, one or more of the first, second, third, fourth, fifth, sixth, and seventh inverting element is an inverter. In one embodiment, the single-ended to differential signal converter further includes, in part, an input buffer supplying the input signal to the first inverter. In one embodiment, the single-ended to differential signal converter further includes, in part, a latch configured to latch the first and second differential signals. In one embodiment, one or more of the fourth, fifth, sixth, and seventh inverting elements are programmable.

In one embodiment, one or more of the fourth, fifth, sixth, and seventh inverting elements includes, in part, a multitude of current conducting legs that are selectively controlled using first and second control signals. Each current conducting leg is adapted to conduct a different amount of current. In one embodiment, one or more of the fourth, fifth, sixth, and seventh inverting elements includes, in part, a multitude of capacitors that are selectively controlled using a third control signal to vary a delay across the inverter.

In one embodiment, the single-ended to differential signal converter further includes, in part, a differential signal sampling circuitry that samples the first and second differential signals to generate a pair of sampled signals; a detector adapted to detect differences between delays of the pair of sampled signals; and a calibration controller adapted to vary, via one or more of the first, second and third control signals, a delay of one or more of the fourth, fifth, sixth, and seventh inverting elements in accordance with the detected differences between the delays of the pair of sampled signals.

In one embodiment, the single-ended to differential signal converter further includes, in part, a first flip-flop that receives the first differential signal at a data terminal of the first flip-flop and the second differential signal at a clock terminal of the first flip-flop; and a second flip-flop that receives the second differential signal at a data terminal of the second flip-flop and the first differential signal at a clock terminal of the second flip-flop. In one embodiment, the single-ended to differential signal converter further includes, in part, a first capacitive element coupled to the input terminal of the first inverting element; and a second capacitive element coupled to the output terminal of the third inverting element.

A non-transitory computer readable medium includes, in part, stored instructions, which when executed by a processor, cause the processor to generate data representative of a single-ended to a differential signal converter. The single-ended to differential signal converter includes, in part, first, second, and third inverting elements coupled in series to form a chain of inverting elements, each of the first, second, and third inverting elements is of a first size. The first inverting element has an input terminal receiving the single-ended signal. The fourth inverting element is of a second size and is coupled to the input terminal of the first inverting element. The fifth inverting element is of a third size and is coupled to an output terminal of the first inverting element. The sixth inverting element is of the third size and is coupled to an output terminal of the second inverting element. The output terminals of the fourth and sixth inverting elements are connected together to form a first one of the differential signals. The seventh inverting element is of the second size and is coupled to an output terminal of the third inverting element. The output terminals of the fifth and seventh inverting elements are connected together to form a second one of the differential signals. The capacitance at the output terminal of each of the first, second and third inverting elements has a value that is substantially the same as the capacitance at the input terminal of the first inverting element In one embodiment, one or more of the first, second, third, fourth, fifth, sixth, and seventh inverting element is an inverter. In one embodiment, the single-ended to differential signal converter further includes, in part, an input buffer supplying the input signal to the first inverter. In one embodiment, the single-ended to differential signal converter further includes, in part, a latch configured to latch the first and second differential signals. In one embodiment, or more of the fourth, fifth, sixth, and seventh inverting elements are programmable.

In one embodiment, one or more of the fourth, fifth, sixth, and seventh inverting elements includes, in part, a multitude of current conducting legs that are selectively controlled using first and second control signals. Each current conducting leg is adapted to conduct a different amount of current. In one embodiment, one or more of the fourth, fifth, sixth, and seventh inverting elements includes, in part, a multitude of capacitors that are selectively controlled using a third control signal to vary a delay across the inverter. In one embodiment, the single-ended to differential signal converter further includes, in part, a differential signal sampling circuitry that samples the first and second differential signals to generate a pair of sampled signals; a detector adapted to detect differences between delays of the pair of sampled signals; and a calibration controller adapted to vary, via one or more of the first, second and third control signals, a delay of one or more of the fourth, fifth, sixth, and seventh inverting elements in accordance with the detected differences between the delays of the pair of sampled signals.

A method of converting a single-ended signal to a differential signal, in accordance with one embodiment of the present disclosure, includes, in part, coupling first, second, and third inverting elements in series to form a chain of inverting elements. Each of the first, second, and third inverting elements is of a first size. The first inverting elements has an input terminal receiving the single-ended signal. The method further includes, in part, coupling a fourth inverting element to the input terminal of the first inverting element. The fourth inverting element is of a second size. The method further includes, in part, coupling a fifth inverting element to an output terminal of the first inverting element. The fifth inverting element is of a third size. The method further includes, in part, coupling a sixth inverting element to an output terminal of the second inverting element. The sixth inverting element is of the third size. The method further includes, in part, coupling output terminals of the fourth and sixth inverting elements together to form a first one of the differential signals. The method further includes, in part, coupling a seventh inverting element to an output terminal of the third inverting element. The seventh inverting element is of the second size. The method further includes, in part, coupling output terminals of the fifth and seventh inverting elements together to form a second one of the differential signals. The capacitance at the output terminal of each of the first, second and third inverting elements has substantially the same value as the capacitance at the input terminal of the first inverting element.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 8A is a schematic diagram of a circuit adapted to sample signals, in accordance with one embodiment of the present disclosure.

FIGS. 8B and 8C are exemplary timing diagrams of the signals associated with FIG. 8A.

DETAILED DESCRIPTION

Differential signals have advantages over single-ended signals. For example, different signals can operate under lower voltages and have better noise immunity than single-ended signals. Differential signals are used in many high-speed I/O systems, such as double-data rate (DDR) memory systems, Universal Serial Bus (USB), High-Definition Multimedia Interface (HDMI), and the like.

Differential signals, including differential clock signals, are critical in half-rate high-speed systems. Single-ended to differential signal converters may have a number of shortcomings. For example, they suffer from a delay mismatch between the differential signals pair. Moreover, the duty cycles of the differential signals generated may fail to meet a desired 50% value.

A single-ended to differential signal converter, in accordance with one embodiment of the present disclosure, is symmetrical to match the impact from the variations caused by the layout and manufacturing on the differential signals. The single-ended to differential signal converter, in accordance with embodiments of the present disclosure, uses weighted interpolation to match the delay between the differential signals. The symmetry is achieved by ensuring that the delays and duty cycles of the differential signals match. Among technical advantages of the present disclosure are conversion of a single-ended to a pair of differential signals that have matching delays and duty cycles.

Figure 1:
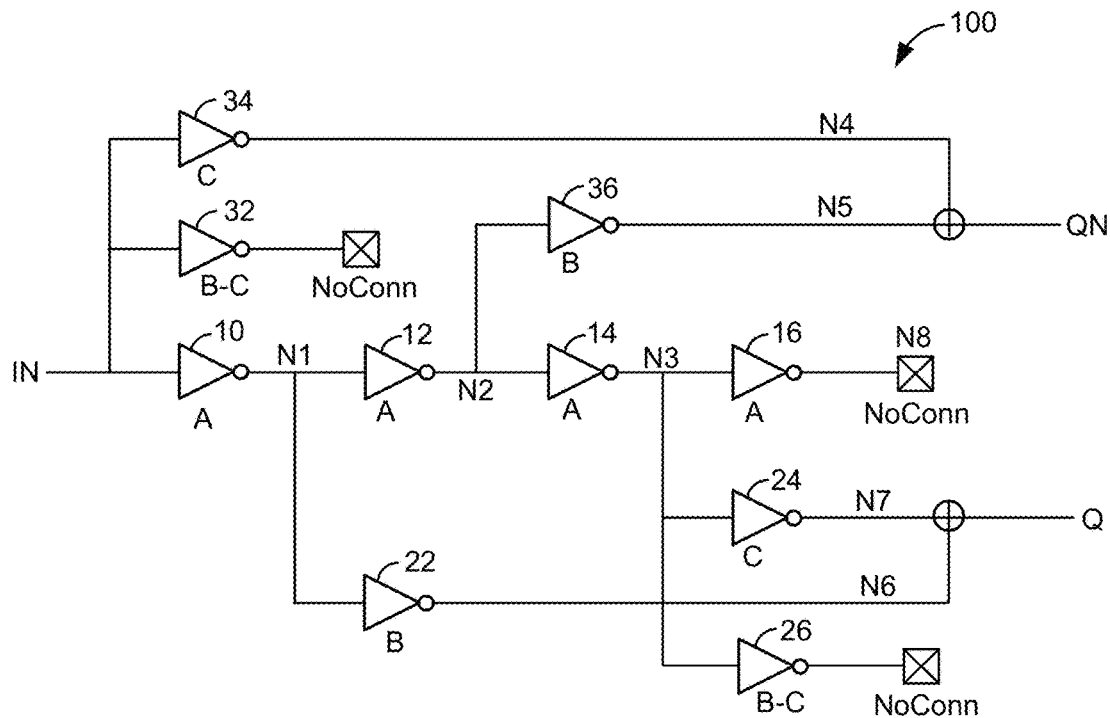
FIG. 1 is a schematic diagram of a single-ended to differential signal converter, in accordance with one embodiment of the present disclosure.

FIG. 1 is a schematic diagram of a single-ended to differential signal converter (hereinafter alternatively referred to as converter) 100, in accordance with one embodiment of the present disclosure. Converter 100, which is shown as including, in part, 10 signal inverting elements, namely signal inverting elements 10, 12, 14, 16, 22, 24, 26, 32, 34, 36, is adapted to convert input signal IN to a pair of differential output signals Q and QN. The following description of the embodiments of the present disclosure are described with reference to each signal inverting element being an inverter. However, it is understood that embodiments of the present disclosure are not so limited and equally apply to any signal inverting element.

Inverters 10, 12, 14 and 16 are cascaded in series and form the main delay path of converter 100. For example, the output of inverter 10 is coupled to the input of inverter of 12, the output of inverter 12 is coupled to the input of inverter 14, and the output of inverter 14 is coupled to the input of inverter 16. Inverter 16 is a dummy inverter whose output is left floating (unconnected). It is understood that the inverters shown in FIG. 1 may be implemented as one or more signal inverting elements such as NAND, NOR, multiplexers, and the like, without deviating from the scope of the present disclosure. Furthermore, the inverters may be implemented by the same type of delay element or different types of delay elements.

Input signal IN that is applied to inverter 10 is also received by inverters 32 and 34. Inverter 32 is also a dummy inverter whose output is left unconnected. Inverter 36 has an input terminal coupled to node N2, which is the same node as the output of inverter 12 and the input of inverter 14. The output terminal of inverter 36 is coupled to the output terminal of inverter 34 to form one of the differential output terminals QN of converter 100.

Inverter 22 has an input terminal coupled to node N1, which is the same node as the output of inverter 10 and the input of inverter 12. Similarly, inverters 24 and 26 have input terminals coupled to node N3. Inverter 26 is a dummy inverter whose output is left unconnected. The output terminals of inverters 22 and 24 are connected to one another to form the other one of the differential output terminals Q of converter 100. In one embodiment, the delay across each inverter may be the minimum delay specified in a given semiconductor manufacturing process.

The signal at node N1 is generated by inverter 10 and has a polarity (phase) that is the inverse of the polarity of the input signal IN. Inverter 10 has a first size, referred to herein as size A as shown in FIG. 1, and generates a delay value that is alternatively referred to hereinafter as a unit delay or UDLY. The size of an inverter may refer to the inverter strength which is dependent on the number of positive-channel metal oxide semiconductor field effect transistors (PMOS) and negative-channel MOS (NMOS) transistors in the inverter, as well as on the channel-width/channel-length (W/L) ratios of the transistors disposed in the inverters. Therefore, the signal at node N1 may be defined as having a polarity that is opposite to the polarity of signal IN and a delay of 1 unit (UDLY) with respect to signal IN, as shown below:

N1: Opposite polarity to signal IN+1*UDLY

In a similar manner, the signals at nodes N2 and N3 have polarities and delays with respect to the signal IN as shown below:

N2: Same polarity as signal IN+2*UDLY
N3: Opposite polarity to signal IN+3*UDLY

Inverters 10, 12, 14, and 16 each have the first size A; therefore, inverters 10, 12, 14, 16 have the same input capacitance. Inverters 22 and 36 each have a second size, referred to herein as size B as shown in FIG. 1, that is different from size A. Inverters 24 and 34 each have a third size, referred to herein as size C as shown in FIG. 1, that is different from sizes A and B. Inverters 32 and 26 each have a fourth size defined by the difference between sizes B and C (i.e., B−C). Inverters 26 and 32 are dummy inverters used to match the capacitive loading along the delay path formed by inverters 10, 12, 14 and 16. Consequently, due to the symmetry and similar loading of inverters 10, 12, 14, and 16, the delays at nodes N1, N2, and N3 are matched.

The polarities and delays of the signals at nodes N4, N5, N6 and N7 with respect to signal IN may therefore be determined as shown below:

N4: Opposite polarity to signal IN+1*UDLY
N5: Opposite polarity to signal IN+3*UDLY
N6: Same polarity as signal IN+2*UDLY
N7: Same polarity as signal IN+4*UDLY Signal QN is formed by the interpolation between (shorting of) nodes N4 and N5. Accordingly, the delay at QN has a value that is between the delays associated with nodes N4 and N5, as determined by the strengths (sizes) of inverters 34 and 36. Similarly, signal Q is formed by the interpolation between nodes N6 and N7.

Accordingly, the delay at Q has a value that is between the delays associated with node N6 and N7, as determined by the strengths of inverters 22 and 24. The rise and fall times of signal QN are determined by the interpolation between the two inverters 34 and 36. The rise and fall times of signal Q are determined by the interpolation between the two inverters 22 and 24.

Inverter sizes B and C may be varied relative to inverter size A to further match the delays between the differential signal pair Q and QN. Table I below shows the polarities and delays associated with one specific implementation of the converter shown in FIG. 1:

TABLE I

| Nodes | Delay/ (one-inverter delay) | Polarity |
| --- | --- | --- |
| IN | 0 | + |
| N1 | 1 | − |
| N2 | 2 | + |
| N3 | 3 | − |
| N8 | 4 | + |
| N6 | 2 | + |
| N7 | 4 | + |
| N4 | 1 | − |
| N5 | 3 | − |
| Q | 2.5 | + |
| QN | 2.5 | − |

Referring to FIG. 1, the ratio between sizes A and B is selected so as to adjust the unit inverter delay. As described above, for each of the nodes IN, N1, N2, N3, N8 disposed in the main delay path, the driving strength (size) of the inverters, namely inverters 10, 12, 14 and 16, is selected to have a value of A. The loading at each of the nodes IN, N1, N2, N3 is (A+B), and the fan-out ratio is (A+B)/A. The lower the ratio of B/A, the smaller is the fan-out ratio, as a consequence, the unit inverter delay becomes smaller. The loading at node N3 is defined by the sum of the sizes of inverters 16, 24, and 26, which is (A+C+(B−C))=(A+B). Therefore, the fan-out ratio at node N3 ratio is (A+B)/A= (1+B/A).

Figure 2:
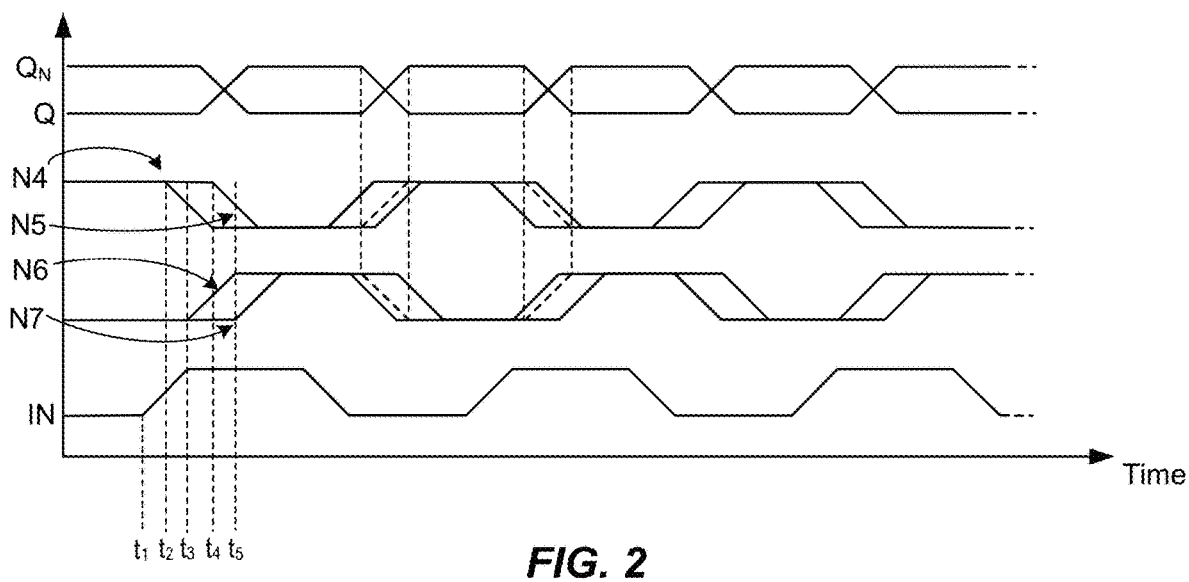
FIG. 2 shows signal waveforms at various nodes of the single-ended to differential signal converter of FIG. 1, in accordance with one embodiment of the present disclosure.

FIG. 2 is an example of the signal waveforms at the interpolated nodes, namely nodes N4, N5, N6, N7 as well as output signal Q and QN of converter 100, in accordance with one embodiment. In response to the rise of signal IN beginning at time $t_1$, the signals at node N4 and N5 are shown as beginning to fall respectively at times $t_2$ and $t_3$, and the signals at node N6 and N7 are shown as beginning to rise respectively at times $t_4$ and $t_5$. Each of the time intervals $(t_3-t_2)$, $(t_4-t_3)$, and $(t_5-t_4)$ corresponds to a unit inverter delay.

Figure 3:
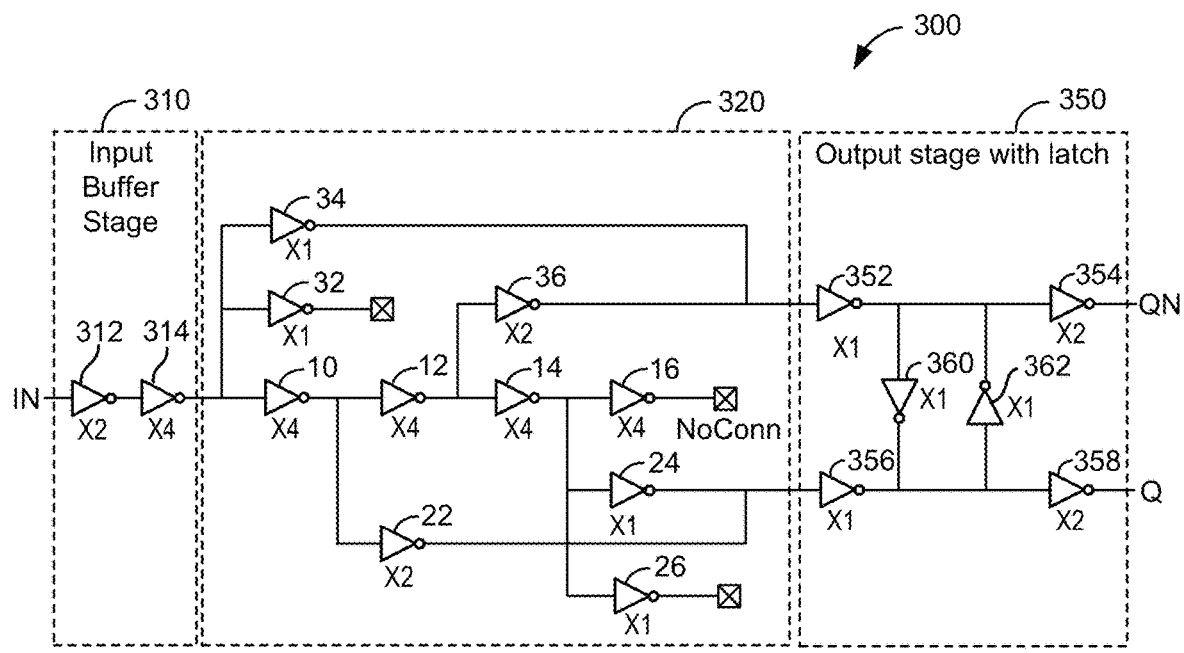
FIG. 3 is a schematic diagram of a single-ended to differential signal converter, in accordance with one embodiment of the present disclosure.

FIG. 3 is a schematic diagram of a single-ended to differential signal converter 200, in accordance with another embodiment of the present disclosure. Converter 300 is shown as including, in part, an input buffer stage 310, an output latch stage 350, and a signal conversion stage 320 electrically coupled between the input buffer and the output latch stages. Signal conversion stage 320 is similar in configuration to signal converter 100 of FIG. 1 except that in signal conversion stage 320, each of the transistors 10, 12, 14, and 16 disposed in the main delay path has a size X4, each of the transistors 22 and 36 has a size X2 that is half the size X4, and each of the transistors 24, 26, 32 and 34 has a size X1 that is half the size X2.

Input buffer stage is shown as including inverters 312 and 314 having respective sizes of X2 and X4. The even number of inverters disposed between input signal IN and output signal Q, as well as between input signal IN and output QN inhibits duty cycle distortion. Output stage latch 350 is shown as including inverters 352, 354, 356, 358, 360 and 362 configured to latch the differential output signals Q and QN. Each of the inverters 352, 356, 360, 362 is of the size X1, and each of the inverters 354, 358 is of the size X2.

Figure 4:
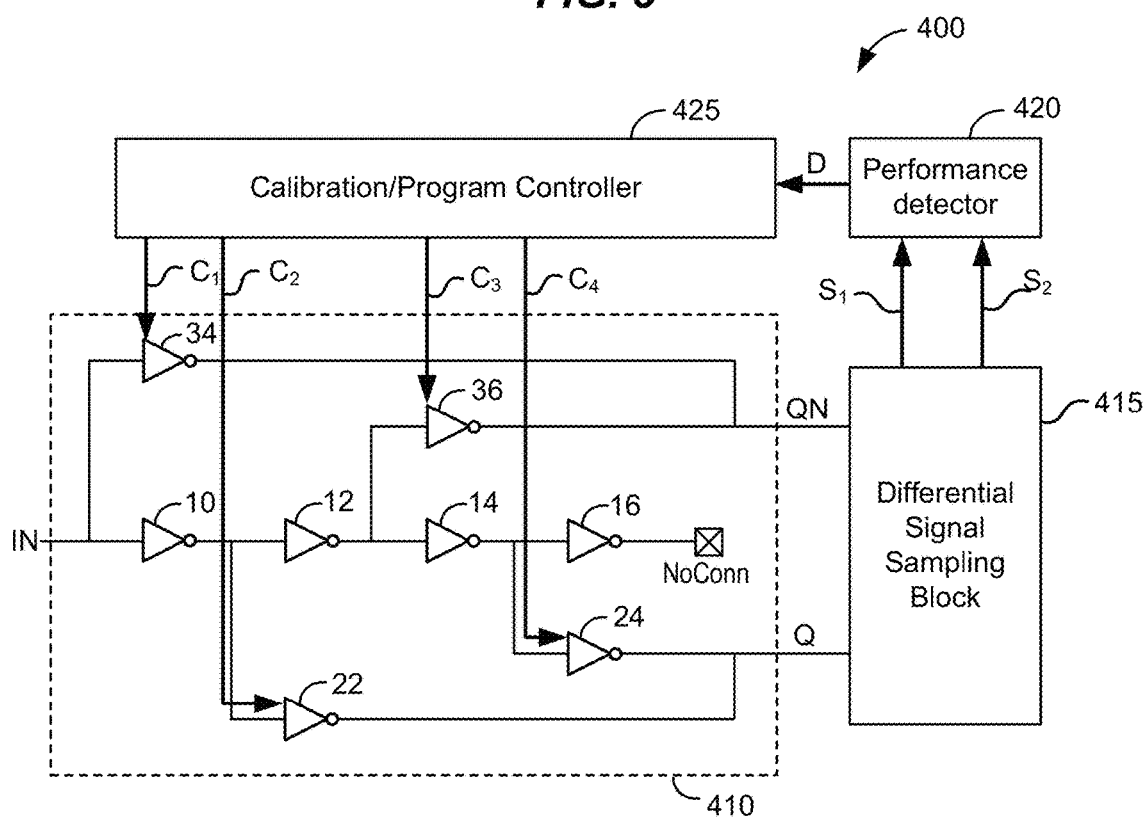
FIG. 4 is a schematic diagram of a single-ended to differential signal converter with internal detection and calibration, in accordance with one embodiment of the present disclosure.

FIG. 4 is a schematic diagram of a single-ended to differential signal converter 400, in accordance with another embodiment of the present disclosure. Converter 400 is shown as including, in part, single-ended to differential signal conversion stage 410, differential signal sampling block 415, performance detector 420, and calibration/program controller 425.

Single-ended to differential signal conversion stage 410 is similar to and operates in the same manner as single-ended to differential signal converter 100 shown in FIG. 1, except that single-ended to differential signal conversion stage 410 does not include dummy inverter 26 and 32. Furthermore, inverters 34, 22, 36 and 24 of single-ended to differential signal conversion stage 410 are programmable so as to enable their delays to be changed, as described below with reference to FIG. 5.

In FIG. 4, differential signal sampling block 415 samples output signals Q and QN of single-ended to differential signal conversion stage 410, and supplies the sampled signals S1 and S2 to performance detector 420. Using the sampled signals S1 and S2, performance detector 420 detects the duty cycle and relative delay values of the differential signals Q, QN. The values detected by differential signal sampling block 415 are delivered to calibration/program controller 425 using signal D. In response to signal D, calibration/program controller 425 varies the PMOS and NMOS strengths of inverters 34, 22, 36, and 24, respectively using signals C1, C2, C3 and C4, to further adjust the delays and duty cycles of signals Q and QN.

Figure 5:
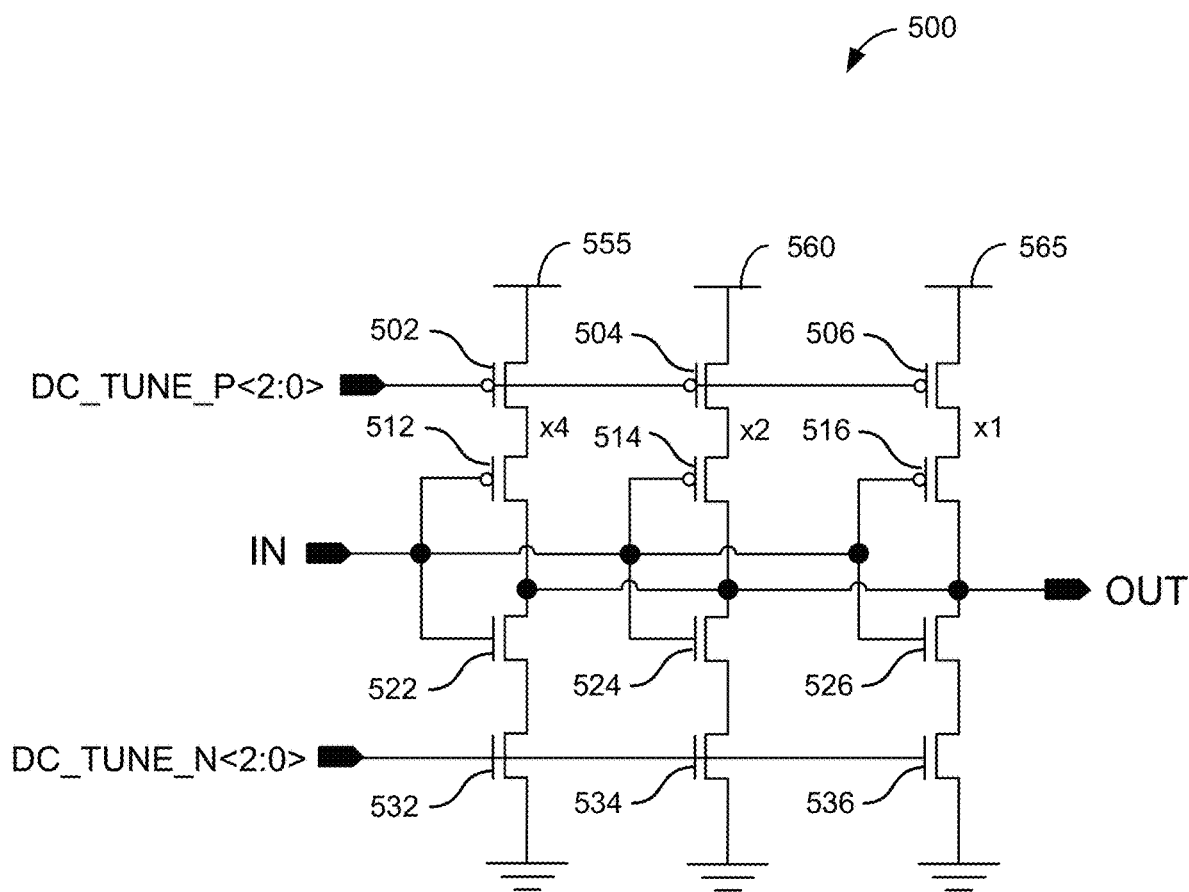
FIG. 5 is a schematic diagram of a programmable inverter disposed in a single-ended to differential signal converter, in accordance with one embodiment of the present disclosure.

FIG. 5 is a transistor schematic diagram of a programmable inverter 500 that corresponds to any of the programmable inverters 34, 22, 36 and 24, as used in single-ended to differential signal converter 400 of FIG. 4, in accordance with one embodiment of the present disclosure. Inverter 500 is shown as including three current conducting legs (alternatively referred to herein as leg) 555, 560 and 565. Leg 555 is shown as including PMOS transistors 502, 512 and NMOS transistors 522, 532.

Similarly, leg 560 is shown as including PMOS transistors 504, 514 and NMOS transistors 524, 534; and leg 565 is shown as including PMOS transistors 506, 516 and NMOS transistors 526, 536. It is understood that inverter 500 may have fewer or more than three legs.

Transistor 502 has a channel-width (W) to channel-length (L) ratio (i.e., W/L) that is, for example, two times the W/L of transistor 504, and four times the W/L of transistor 506. Similarly, transistor 512 has a W/L that is two times the W/L of transistor 514, and four times the W/L of transistor 516; transistor 522 has a W/L that is two times the W/L of transistor 524, and four times the W/L of transistor 526; and transistor 532 has a W/L ratio that is two times the W/L of transistor 534, and four times the W/L of transistor 536. Therefore, leg 555 has a current drive strength that is twice larger than the current drive strength of leg 560, and four times larger than the current drive strength of leg 565.

In response to the exemplary 2-bit control signal DC_TUNE_P<2:0> and DC_TUNE_N<2:0>, one of the legs may be activated (i.e., receives power) and the other two legs may be deactivated. For example, by setting signals DC_TUNE_P<2:0> DC_TUNE_N<2:0> so as to cause transistors 502 and 532 to be on and transistors 504, 506, 534, 536 to be off, leg 555 is activated and legs 560 and 565 are deactivated. Because leg 555 has two times the current drive strength of leg 560, the delay from input terminal IN to output terminal OUT is two times less when leg 555 is activated (while legs 560 and 565 are deactivated) compared to when leg 560 is activated (while legs 555 and 565 are deactivated). Similarly, because leg 555 has four times the current drive strength of leg 565, the delay from input terminal IN to output terminal OUT is four times less when leg 555 is activated (while legs 560 and 565 are deactivated) compared to when leg 565 is activated (while legs 555 and 560 are deactivated). It is understood that one, two, or all three current legs may be activate at any given time using signals DC_TUNE_P<2:0> DC_TUNE_N<2:0>.

Signals DC_TUNE_P<2:0> and DC_TUNE_N<2:0> correspond to any of the signals C1, C2, C3 and C4 shown in FIG. 4. In the example shown in FIG. 5, bits 0, 1 and 2 of signal DC_TUNE_P<2:0> are respectively applied to PMOS transistors 502, 504 and 506, and bits 0, 1 and 2 of signal DC_TUNE_N<2:0> are respectively applied to NMOS transistors 532, 534 and 536. The delays and duty cycle of signals Q and QN of converter 400 of FIG. 4 may be adjusted by selectively activating one or more PMOS/NMOS legs of inverter 500 via signals DC_TUNE_P<2:0> and DC_TUNE_N<2:0>.

Figure 6:
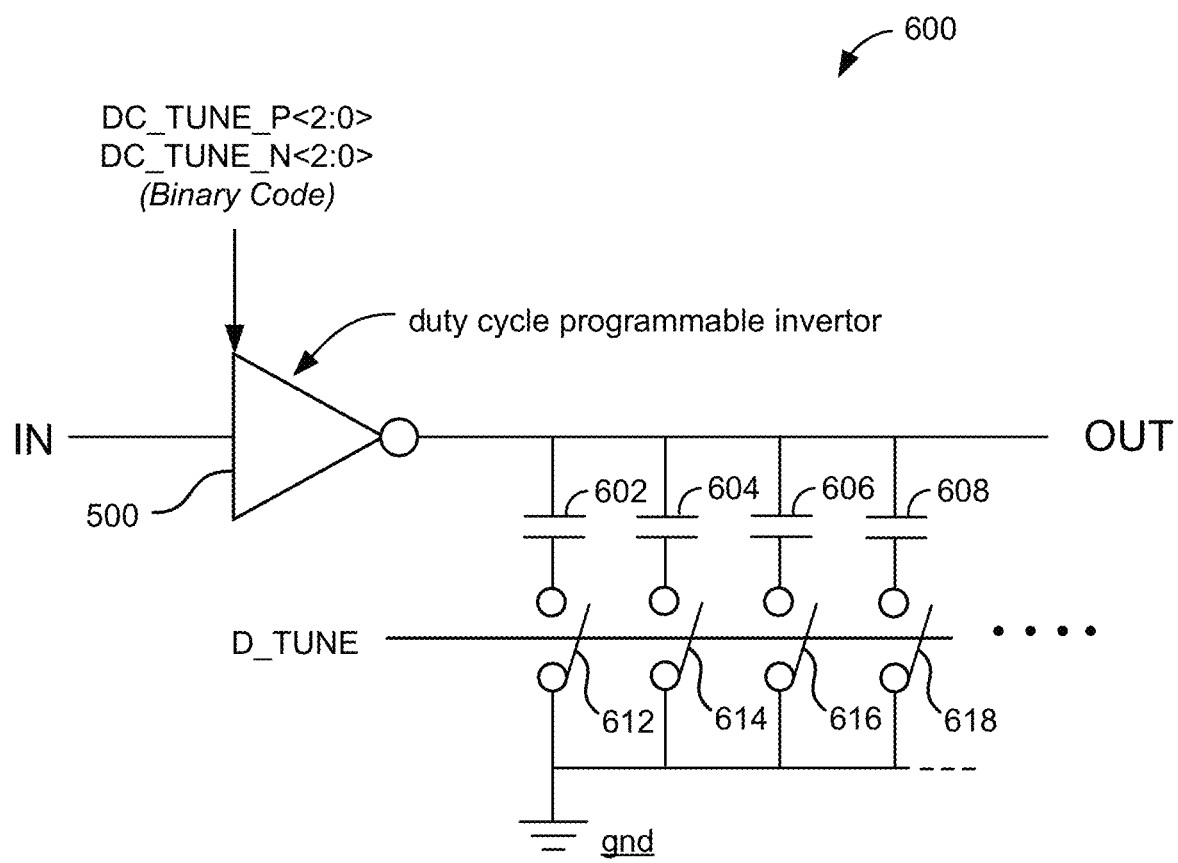
FIG. 6 is a schematic diagram of a programmable inverter disposed in a single-ended to differential signal converter, in accordance with one embodiment of the present disclosure.

FIG. 6 is a transistor schematic diagram of a programmable inverter 600 that corresponds to any of the inverters 34, 22, 36, and 24 used in single-ended to differential signal converter 400 of FIG. 4, in accordance with one embodiment of the present disclosure. Programmable inverter 600 is shown as including an inverter 500 as described above with reference to FIG. 5, as well as a multitude of capacitors, four of which, namely capacitors 602, 604, 606, and 608 are shown. It is understood, however, that inverter 600 may have any number of capacitors.

Each of the capacitors 602, 604, 606, and 608 is selectively coupled between the ground terminal and the output of inverter 500 via an associated switch that is opened or closed using a multi-bit control signal D_TUNE. For example, by closing switch 612 using signal D_TUNE, the output of inverter 500 receives the capacitive loading associated with capacitor 602. Switches 614, 616 and 618 are shown as being disposed respectively between the ground terminal and capacitors 604, 606 and 608. By turning the switches on or off, the capacitive loading of output terminal OUT of inverter 600 may thus be varied.

Signal D_TUNE may have any number of bits, for example, 8 bits. Each bit of signal D_TUNE is used to open or close one of the switches. In one embodiment, signal D_TUNE is a thermometer code. By varying the capacitive loading of output signal OUT, the delay across programmable inverter 600 may be changed. Referring concurrently to FIGS. 4, 5, and 6, in one embodiment, the duty cycle of signals Q and QN may be first matched using control signals DC_TUNE_P<2:0> and DC_TUNE_N<2:0>, as described above with reference to FIG. 5. Thereafter, the delay between signals Q and QN may be matched using the control signal D_TUNE.

Figure 7:
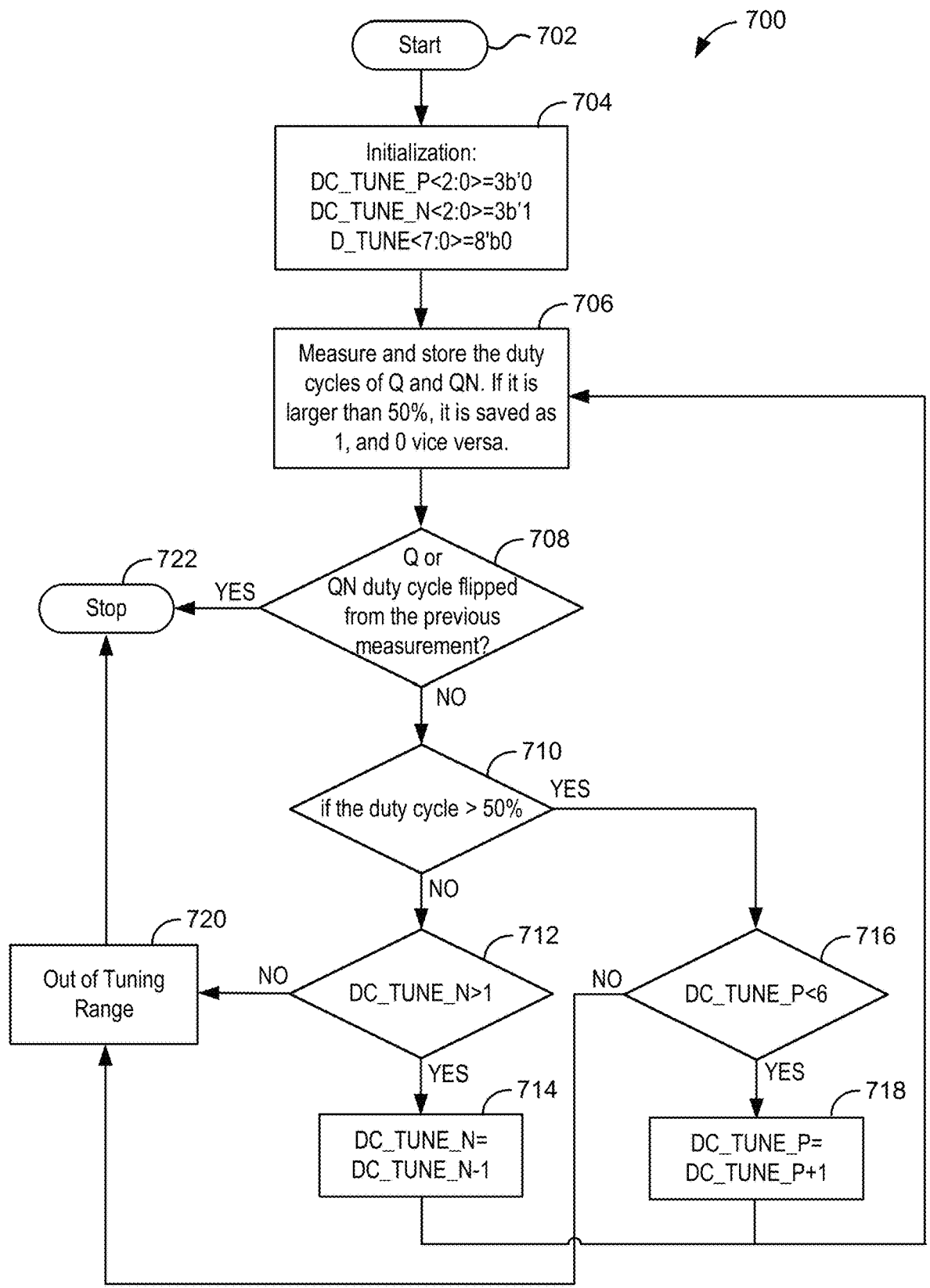
FIG. 7 is a flowchart for adjusting the duty cycles of a pair of differential signals, in accordance with one embodiment of the present disclosure.

FIG. 7 is an exemplary flowchart 700 for adjusting the duty cycles of signals Q and QN of converter 400 in accordance with one embodiment of the present disclosure. Each of the inverters 34, 22, 36 and 24 of converter 400 corresponds to inverter 600 shown in FIG. 6. Accordingly, concurrent references are made to FIGS. 4-7 in describing flowchart 700.

At 702, the process for adjusting the duty cycle of signals Q and QN starts. At 704, the exemplary 3-bit control signals DC_TUNE_P<2:0>, DC_TUNE_N<2:0>, and exemplary 8-bit control signal D_TUNE<7:0> are initialized. Signal DC_TUNE_P<2:0> is used to turn on or turn off PMOS transistors 502, 504 and/or 506, and signal DC_TUNE_N<2:0> is used to turn on or turn off NMOS transistors 532, 534 and/or 536 DC_TUNE_N<2:0>, as described above with reference to FIG. 5. Signal D_TUNE<7:0> is used to control switches that couple or uncouple the multitude of capacitors from the output terminal of inverter 500, as described above with reference to FIG. 6. At 706, the duty cycles of signals Q and QN are sampled. A duty cycle greater than 50% is stored as a logic 1, and a duty cycle smaller than 50% is stored as a logic 0.

It is appreciated that although the present disclosure is described with respect to a duty cycle of 50%, the present disclosure may be extended to another desired duty cycle, without deviating from the scope of the present disclosure. If at 708, a determination is made that duty cycles of signals Q and QN have flipped from their previous values (i.e., from 1 to 0, or from 0 to 1), then the duty cycle adjustment ends at 722. If at 708, a determination is made that the sampled duty cycles of signals Q and QN have not flipped from their previous values, then at 710, a determination is made as to whether the sampled duty cycles are great than 50%. If at 710, a determination is made that the sampled duty cycles are great than 50%, and it is further determined at 716 that the value of the exemplary 3-bit control signal DC_TUNE_P is less than 6, then at 718, signal DC_TUNE_P is increased by a count of 1, subsequent to which the process is repeated at 706. Signal DC_TUNE_P has a maximum value of 6 in this example.

If at 710, a determination is made that the sampled duty cycles are smaller than 50%, and it is further determined at 712 that the value of the exemplary signal DC_Tune_N is greater than 1, then at 714 signal DC_TUNE_N is decremented by a count of 1, subsequent to which the process is repeated at 706. If at 716, it is determined that the value of signal DC_TUNE_P is not less than 6, then the sampled duty cycle tuning is determined to be out of tuning range at 720, subsequent to which the process ends at 722. Likewise, if at 712, it is determined that the value of signal DC_TUNE_N is not greater than 1, then the duty cycle tuning is determined to be out of tuning range at 720, subsequent to which the process ends at 722. Signal DC_TUNE_has a minimum value of 1 in this example.

To further match the delay between the differential signals Q and QN, as described above with reference to any of the converters 100, 300 and/or 400, in some embodiments a pair of flip-flops may be used. FIG. 8A shows a pair of flip-flops 802 and 804 that are used to receive signals Q and QN, and generate signals Out1 and Out0 in response. Flip-flop 802 is shown as receiving signal Q at its data input terminal and signal QN at its clock input terminal to generate signal Out1. Flip-flop 804 is shown as receiving signal QN at its data input terminal and signal Q at its clock input terminal to generate signal Out0.

FIG. 8B shows exemplary waveforms 820 and 822 associated with signals Q and QN of FIG. 8A and according to which signal Q leads signal QN in phase. At time $t_1$, because signal Q makes a low-to-high transition and signal QN is at a high logic level, signal Out0 is set to a high logic level. At time $t_2$, because signal QN makes a low-to-high transition and signal Q is at a low logic level, signal Out1 is set to a low logic level.

FIG. 8C shows exemplary waveforms 824 and 826 associated with signals Q and QN of FIG. 8A and according to which signal Q lags signal QN in phase. At time $t_3$, because signal Q makes a low-to-high transition and signal QN is at a low logic level, signal Out0 is set to a low logic level. At time $t_4$, because signal QN makes a low-to-high transition and signal Q is at a high logic level, signal Out1 is set to a high logic level.

Figure 9:
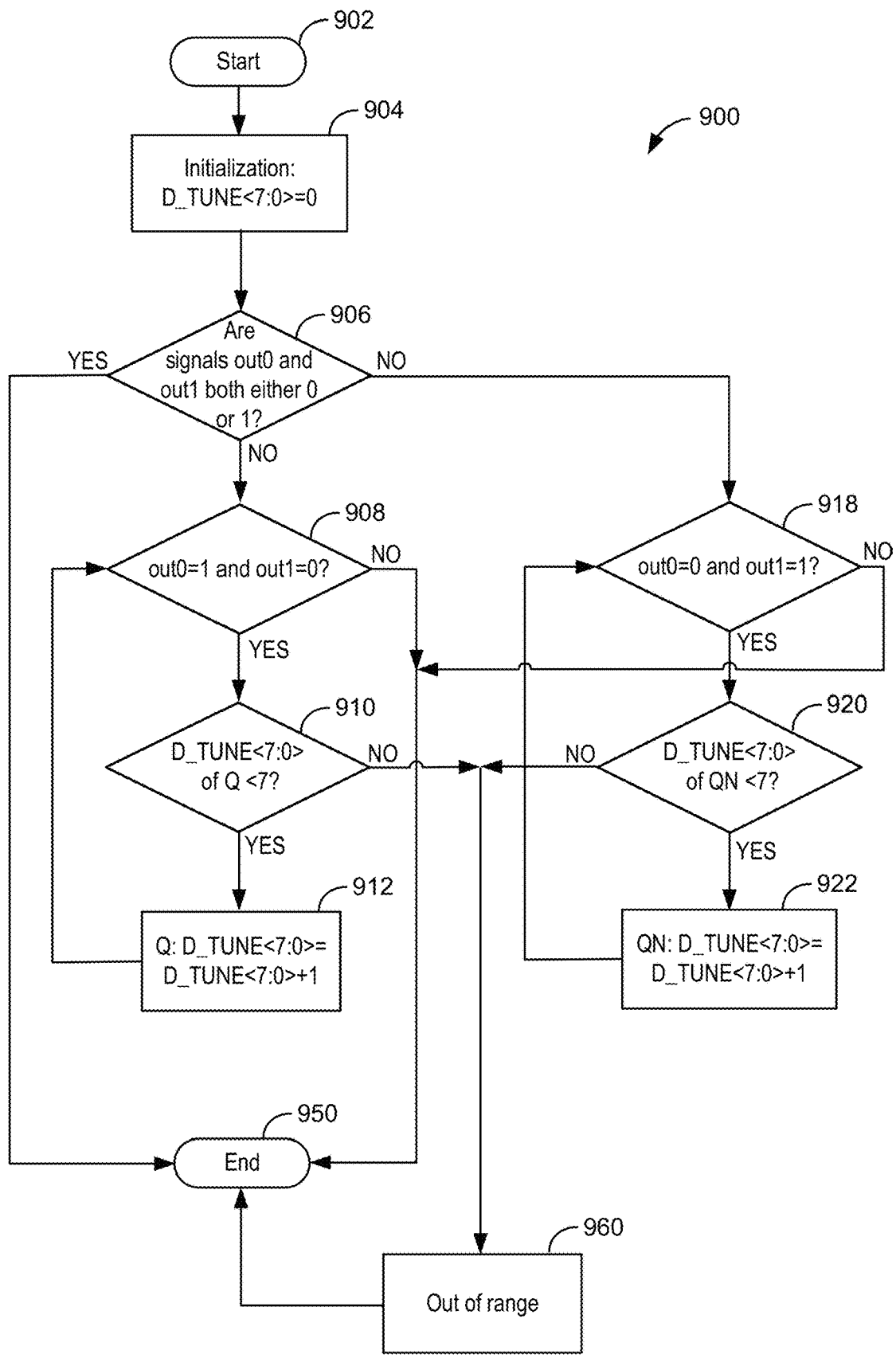
FIG. 9 is a flowchart for matching the delays between a pair of differential signals, in accordance with one embodiment of the present disclosure.

FIG. 9 is a flowchart 900 for matching the delays between signals Q and QN in accordance with one exemplary embodiment of the present disclosure. To achieve this matching, signals Out0 and Out1, described above with reference to FIGS. 8A, are used. Concurrent references to FIGS. 4-6, 8A, and 9 are made in describing flowchart 900. After staring the delay matching at 902, exemplary 8-bit thermometer control signal D_TUNE<7:0> is initialized to 0. If at 906 it is determined that both signals Out0 and Out1 are either 0 or 1, then signals Q and QN are determined to transition closely to one another and therefore no further delay adjustment is performed; accordingly, the process ends at 950. If at 906, it is determined that signals Out0 and Out1 are not both either 0 or 1, then the flow defined by steps 908, 910, 912 associated with signal Q is traversed, and/or the flow defined by steps 918, 920, 922 associated with signal QN is traversed.

If at 908, signal Out0 is determined to be 0 and signal Out1 is determined to be 1, and at 910 exemplary 8-bit thermometer control signal D_TUNE<7:0> associated with signal Q is determined to be less than 7, then at 912 signal D_TUNE<7:0> is incremented by a count of 1 to change the delay associated with signal Q, subsequent to which the process is repeated at 908. If at 908 signals Out0 and Out1 are determined not to be 0 and 1 respectively, then the process ends at 950. If at 910, signal D_TUNE<7:0> associated with signal Q is determined not to be less than 7, then the delays are determined as being out of range at 960, subsequent to which the process ends at 950.

If at 918, signal Out1 is determined to be 0 and signal Out0 is determined to be 1, and at 920 the thermometer control signal D_TUNE<7:0> associated with signal QN is determined to be less than 7, then at 922 signal D_TUNE<7:0> is incremented by a count of 1 to change the delay associated with signal QN, subsequent to which the process is repeated at 918. If at 918, signals Out0 and Out1 are determined not to be 1 and 0 respectively, then the process ends at 950. If at 920, signal D_TUNE<7:0> associated with signal QN is determined not to be less than 7, then the delays are determined as being out of range at 960 subsequent to which the process ends at 950.

Figure 10:
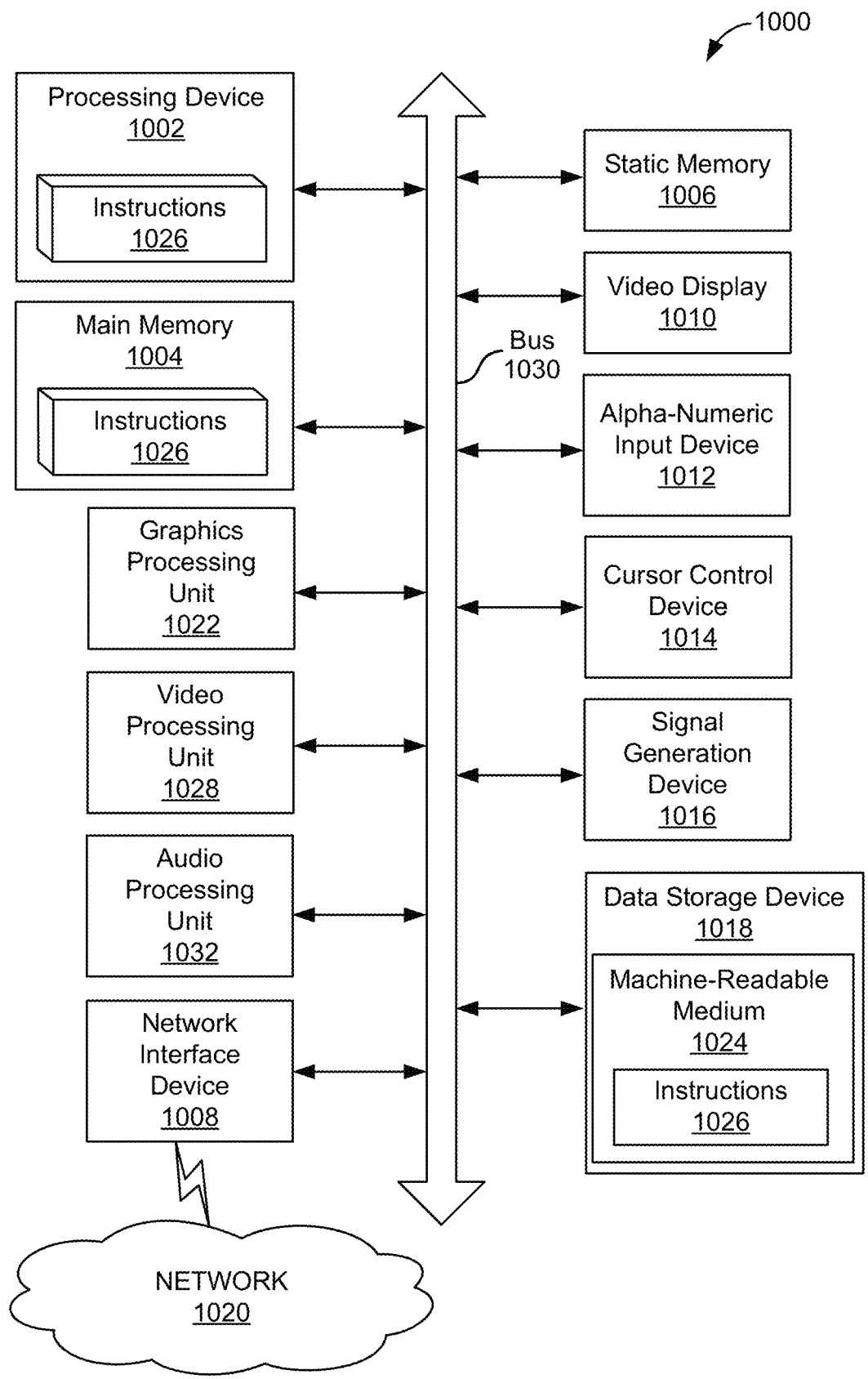
FIG. 10 depicts an example diagram of a computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked)

to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, and the like.

What is claimed is:

1. A single-ended to a differential signal converter comprising:
   first, second, and third inverting elements coupled in series to form a chain of inverting elements, each of the first, second, and third inverting elements being of a first size, wherein the first inverting element has an input terminal receiving the single-ended signal;
   a fourth inverting element being of a second size and coupled to the input terminal of the first inverting element;
   a fifth inverting element being of a third size and coupled to an output terminal of the first inverting element;
   a sixth inverting element being of the third size and coupled to an output terminal of the second inverting element, wherein output terminals of the fourth and sixth inverting elements are connected together to form a first one of the differential signals; and
   a seventh inverting element being of the second size and coupled to an output terminal of the third inverting element, wherein output terminals of the fifth and seventh inverting elements are connected together to form a second one of the differential signals, wherein a capacitance at the output terminal of each of the first, second and third inverting elements has a value that is substantially a same as a capacitance at the input terminal of the first inverting element.

2. The single-ended to differential signal converter of claim 1 wherein one or more of the first, second, third, fourth, fifth, sixth, and seventh inverting element is an inverter.

3. The single-ended to differential signal converter of claim 2 further comprising:
   an input buffer supplying the input signal to the first inverter.

4. The single-ended to differential signal converter of claim 3 further comprising:
   a latch configured to latch the first and second differential signals.

5. The single-ended to differential signal converter of claim 1 wherein one or more of the fourth, fifth, sixth, and seventh inverting elements are programmable.

6. The single-ended to differential signal converter of claim 5 wherein one or more of the fourth, fifth, sixth, and seventh inverting elements comprises a plurality of current conducting legs that are selectively controlled using first and second control signals, each current conducting leg adapted to conduct a different amount of current.

7. The single-ended to differential signal converter of claim 6 wherein one or more of the fourth, fifth, sixth, and seventh inverting elements comprise a plurality of capacitors that are selectively controlled using a third control signal to vary a delay across the inverter.

8. The single-ended to differential signal converter of claim 7 further comprising:
   a differential signal sampling circuitry that samples the first and second differential signals to generate a pair of sampled signals;
   a detector adapted to detect differences between delays of the pair of sampled signals; and
   a calibration controller adapted to vary, via one or more of the first, second and third control signals, a delay of one or more of the fourth, fifth, sixth, and seventh inverting elements in accordance with the detected differences between the delays of the pair of sampled signals.

9. The single-ended to differential signal converter of claim 8 further comprising:
   a first flip-flop that receives the first differential signal at a data terminal of the first flip-flop and the second differential signal at a clock terminal of the first flip-flop; and
   a second flip-flop that receives the second differential signal at a data terminal of the second flip-flop and the first differential signal at a clock terminal of the second flip-flop.

10. The single-ended to differential signal converter of claim 1 further comprising:
    a first capacitive element coupled to the input terminal of the first inverting element; and
    a second capacitive element coupled to the output terminal of the third inverting element.

11. A non-transitory computer readable medium comprising stored instructions, which when executed by a processor, cause the processor to generate data representative of a single-ended to a differential signal converter, the single-ended to differential signal converter comprising:
    first, second, and third inverting elements coupled in series to form a chain of inverting elements, each of the first, second, and third inverting elements being of a first size, wherein the first inverting element has an input terminal receiving the single-ended signal;
    a fourth inverting element being of a second size and coupled to the input terminal of the first inverting element;
    a fifth inverting element being of a third size and coupled to an output terminal of the first inverting element;
    a sixth inverting element being of the third size and coupled to an output terminal of the second inverting element, wherein output terminals of the fourth and sixth inverting elements are connected together to form a first one of the differential signals; and
    a seventh inverting element being of the second size and coupled to an output terminal of the third inverting element, wherein output terminals of the fifth and seventh inverting elements are connected together to form a second one of the differential signals, wherein a capacitance at the output terminal of each of the first, second and third inverting elements has a value that is substantially a same as a capacitance at the input terminal of the first inverting element.

12. The non-transitory computer readable medium of claim 11 wherein one or more of the first, second, third, fourth, fifth, sixth, and seventh inverting element is an inverter.

13. The non-transitory computer readable medium of claim 12 wherein the single-ended to differential signal converter further comprises an input buffer supplying the input signal to the first inverter.

14. The non-transitory computer readable medium of claim 13 wherein the single-ended to differential signal converter further comprises a latch configured to latch the first and second differential signals.

15. The non-transitory computer readable medium of claim 11 wherein one or more of the fourth, fifth, sixth, and seventh inverting elements are programmable.

16. The non-transitory computer readable medium of claim 15 wherein one or more of the fourth, fifth, sixth, and seventh inverting elements comprises a plurality of current conducting legs that are selectively controlled using first and second control signals, each current conducting leg adapted to conduct a different amount of current.

17. The non-transitory computer readable medium of claim 16 wherein one or more of the fourth, fifth, sixth, and seventh inverting elements comprise a plurality of capacitors that are selectively controlled using a third control signal to vary a delay across the inverter.

18. The non-transitory computer readable medium of claim 17 wherein the single-ended to differential signal converter further comprises:
- a differential signal sampling circuitry that samples the first and second differential signals to generate a pair of sampled signals;
- a detector adapted to detect differences between delays of the pair of sampled signals; and
- a calibration controller adapted to vary, via one or more of the first, second and third control signals, a delay of one or more of the fourth, fifth, sixth, and seventh inverting elements in accordance with the detected differences between the delays of the pair of sampled signals.

19. A method of converting a single-ended signal to a differential signal, the method comprising:
- coupling first, second, and third inverting elements in series to form a chain of inverting elements, each of the first, second, and third inverting elements being of a first size, wherein the first inverting element has an input terminal receiving the single-ended signal;
- coupling a fourth inverting element to the input terminal of the first inverting element, the fourth inverting element being of a second size;
- coupling a fifth inverting element to an output terminal of the first inverting element, the fifth inverting element being of a third size;
- coupling a sixth inverting element to an output terminal of the second inverting element, the sixth inverting element being of the third size;
- coupling output terminals of the fourth and sixth inverting elements together to form a first one of the differential signals;
- coupling a seventh inverting element to an output terminal of the third inverting element, the seventh inverting element being of the second size; and
- coupling output terminals of the fifth and seventh inverting elements together to form a second one of the differential signals, wherein a capacitance at the output terminal of each of the first, second and third inverting elements has a value that is substantially a same as a capacitance at the input terminal of the first inverting element.

* * * * *